US010714201B2

(12) United States Patent
Lee et al.

(10) Patent No.: US 10,714,201 B2
(45) Date of Patent: Jul. 14, 2020

(54) MEMORY SYSTEM CAPABLE OF PRE-SCREENING INTERNAL TRANSISTORS (71) Applicant: eMemory Technology Inc., Hsin-Chu (TW)

(72) Inventors: Chieh-Tse Lee, Hsinchu County (TW); Chun-Hung Lin, Hsinchu County (TW); Cheng-Da Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/573,998

(22) Filed: Sep. 17, 2019

(65) Prior Publication Data

US 2020/0126630 A1 Apr. 23, 2020

Related U.S. Application Data (60) Provisional application No. 62/746,557, filed on Oct. 17, 2018.

(51) Int. Cl.
*G11C 17/18* (2006.01)
*G11C 8/08* (2006.01)
*G11C 7/12* (2006.01)
*G11C 17/16* (2006.01)
*G11C 29/00* (2006.01)
*G11C 29/02* (2006.01)

(52) U.S. Cl.
CPC ............... *G11C 17/18* (2013.01); *G11C 7/12* (2013.01); *G11C 8/08* (2013.01); *G11C 17/16* (2013.01); *G11C 29/027* (2013.01); *G11C 29/785* (2013.01)

(58) Field of Classification Search
CPC .. G11C 17/18; G11C 8/08; G11C 7/12; G11C 17/16; G11C 29/785; G11C 29/027
See application file for complete search history.

(56) References Cited

U.S. PATENT DOCUMENTS

| 9,620,176 | B2 | 4/2017 | Wu |
| 9,799,662 | B2* | 10/2017 | Wong ................. H01L 23/5226 |
| 10,475,491 | B2* | 11/2019 | Chen ........................ G11C 7/12 |
| 2005/0201152 | A1 | 9/2005 | Nguyen |
| 2017/0148801 | A1* | 5/2017 | Wong .................... H01L 23/528 |
| 2019/0189231 | A1* | 6/2019 | Omid-Zohoor ......... H01L 28/00 |

* cited by examiner

Primary Examiner — Fernando Hidalgo
(74) Attorney, Agent, or Firm — Winston Hsu (57) ABSTRACT A memory system includes a plurality of memory cells. A memory cell includes an anti-fuse transistor, a first select unit, and a second select unit. The anti-fuse transistor has a first terminal, a second terminal, and a control terminal coupled to an anti-fuse control line. The first select unit is coupled to the first terminal of the anti-fuse transistor, a first bit line, and an odd word line. The second select unit is coupled to the second terminal of the anti-fuse transistor, a second bit line, and an even word line. During a pre-screen operation of the memory cell, the odd word line and the even word line are at different voltages.

24 Claims, 9 Drawing Sheets

MEMORY SYSTEM CAPABLE OF PRE-SCREENING INTERNAL TRANSISTORS

CROSS REFERENCE TO RELATED APPLICATIONS

This non-provisional application claims priority of U.S. provisional application No. 62/746,557, filed on Oct. 17, 2018, included herein by reference in its entirety.

BACKGROUND OF THE INVENTION

1. Field of the Invention

The present invention is related to a memory system, and more particularly, to a memory system capable of pre-screening internal transistors.

2. Description of the Prior Art

The one-time programmable (OTP) memory is a special type of non-volatile memory (NVM) that permits data to be written to memory only once. That is, once the memory cell has been programmed, it will retain the value even when the system power is off. The OTP memory can be very useful when reliable and repeatable reading of data is required. For example, the system boot code, the encryption keys, and the configuration parameters may be stored in the one-time programmable memory.

However, due to process defects, the selection transistors of the OTP memory may have different controlling ability. For example, some of the selection transistors may be more difficult to be turned off, and the leakage currents generated by these selection transistors may interfere with the reading currents and cause reading errors. In prior art, these abnormal selection transistors cannot be found before the memory cells have been programmed. That is, the user cannot avoid this issue in advance, thus increasing the instability of the system and increasing the cost of subsequent maintenance.

SUMMARY OF THE INVENTION

One embodiment of the present invention discloses a memory system. The memory system includes a plurality of even word lines, a plurality of odd word lines, a plurality of anti-fuse control lines, a plurality of bit lines, and a plurality of memory cells.

A memory cell of the plurality of memory cells includes an anti-fuse transistor, a first select unit, and a second select unit. The anti-fuse transistor has a first terminal, a second terminal, and a control terminal coupled to a first anti-fuse control line of the plurality of anti-fuse control lines. The first select unit coupled to the first terminal of the anti-fuse transistor, a first bit line of the plurality of bit lines, and a first odd word line of the plurality of odd word lines. The first select unit controls the electrical connection between the first terminal of the first anti-fuse transistor and the first bit line according to a voltage of the first odd word line. The second select unit is coupled to the second terminal of the anti-fuse transistor, a second bit line of the plurality of bit lines, and a first even word line of the plurality of even word lines. The second select unit controls the electrical connection between the second terminal of the first anti-fuse transistor and the second bit line according to a voltage of the first even word line.

During an individual pre-screen operation of the first memory cell, the first odd word line and the first even word line are at different voltages.

Another embodiment of the present invention discloses a method for operating a memory system. The memory system includes a plurality of memory cells. A memory cell of the plurality of memory cells includes an anti-fuse transistor, a first select unit and a second select unit.

The anti-fuse transistor has a first terminal, a second terminal, and a control terminal coupled to a first anti-fuse control line. The first select unit is coupled to the first terminal of the anti-fuse transistor, a first bit line, and a first odd word line. The second select unit is coupled to the second terminal of the anti-fuse transistor, a second bit line, and a first even word line.

The method includes during a first screen phase of an individual pre-screen operation of the first memory cell, pre-charging the first bit line and the second bit line to different voltages, applying different voltages to the first odd word line and the first even word line, and sensing a current on the first bit line or the second bit line to determine if the first select unit or the second select unit is defected.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
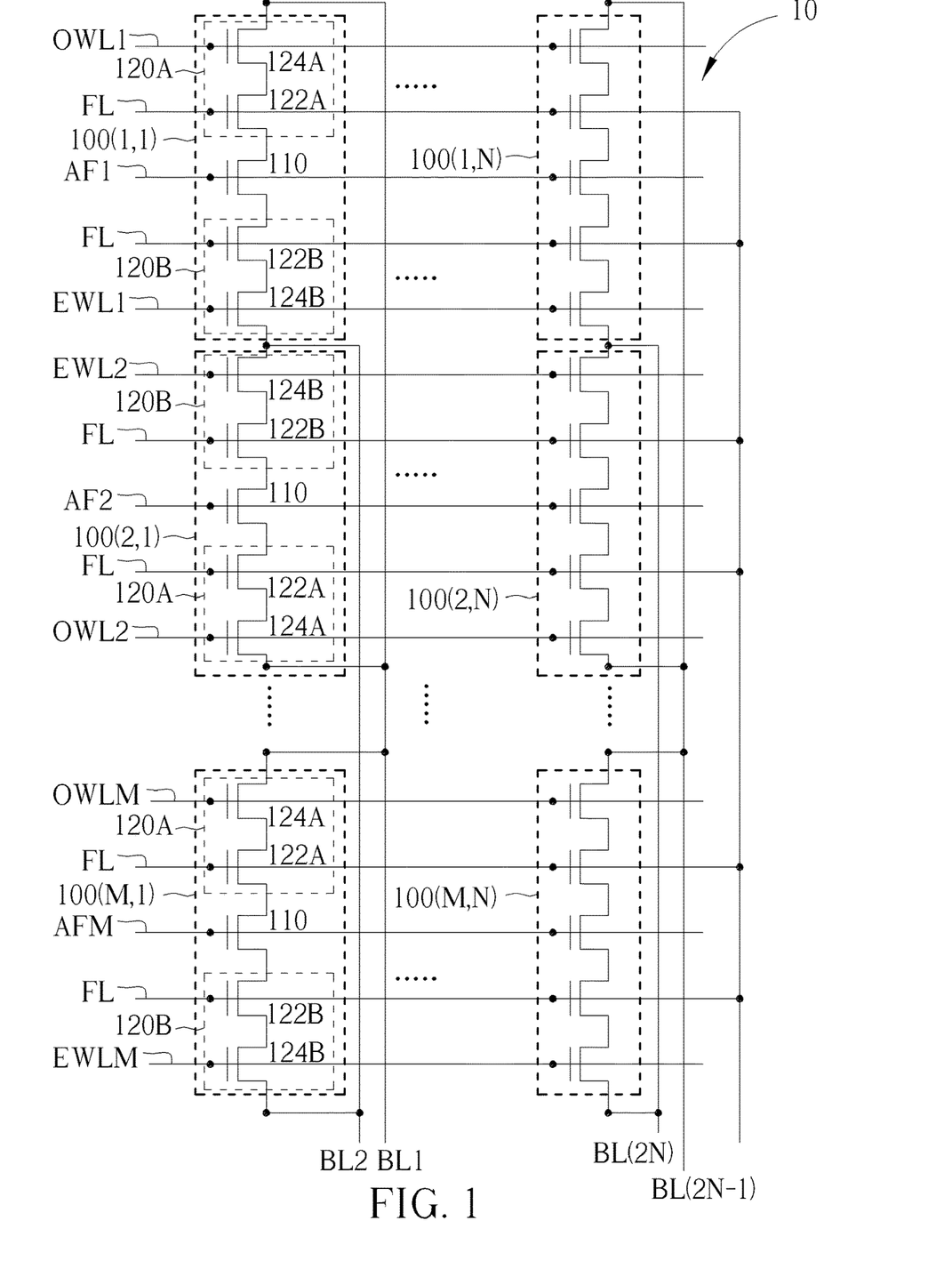
FIG. 1 shows a memory system according to one embodiment of the present invention.

FIG. 1 shows a memory system 10 according to one embodiment of the present invention. The memory system 10 includes a plurality of even word lines EWL1 to EWLM, a plurality of odd word lines OWL1 to OWLM, a plurality of anti-fuse control lines AF1 to AFM, a plurality of bit lines BL1 to BL(2N), and a plurality of memory cells 100(1,1) to 100(M,N).

In FIG. 1, memory cells disposed in the same row can be coupled to the same even word line, the same odd word line, and the same anti-fuse control line, and memory cells disposed in the same column can be coupled to the same bit lines. For example, the memory cells 100(1,1) to 100(1,N) are disposed in the same row, and the memory cells 100(M, 1) to 100(M,N) are disposed in the same row. In this case, the memory cells 100(1,1) to 100(1,N) are coupled to the even word line EWL1, the odd word line OWL1, and the anti-fuse control line AF1 while the memory cells 100(M,1) to 100(M,N) are coupled to the even word line EWLM, the odd word line OWLM, and the anti-fuse control line AFM.

Also, the memory cells 100(1,1) to 100(M,1) are disposed in the same column, and the memory cells 100(1,N) to 100(M,N) are disposed in the same column. In this case, the memory cells 100(1,1) to 100(M,1) are coupled to the bit lines BL1 and BL2 while the memory cells 100(1,N) to 100(M,N) are coupled to the bit lines BL(2N-1) and BL(2N).

In some embodiments, the memory cells 100(1,1) to 100(M,N) can have the same structures. For example, the memory cell 100(1,1) can include an anti-fuse transistor 110, and select units 120A and 120B.

The anti-fuse transistor 110 has a first terminal, a second terminal, and a control terminal coupled to the anti-fuse control line AF1.

The select unit 120A is coupled to the first terminal of the anti-fuse transistor 110, the bit line BL1, and the odd word line OWL1. The select unit 120A can control the electrical connection between the first terminal of the anti-fuse transistor 110 and the bit line BL1 according to the voltage of the odd word line OWL1.

The select unit 120B is coupled to the second terminal of the anti-fuse transistor 110, the bit line BL2, and the even word line EWL1. The select unit 120B can control the electrical connection between the second terminal of the anti-fuse transistor 110 and the bit line BL2 according to a voltage of the even word line EWL1.

In FIG. 1, the select unit 120A includes a following gate transistor 122A and a select transistor 124A. The following gate transistor 122A has a first terminal coupled to the first terminal of the anti-fuse transistor 110, a second terminal, and a control terminal coupled to a following gate control line FL. The select transistor 124A has a first terminal coupled to the second terminal of the following gate transistor 122A, a second terminal coupled to the bit line BL1, and a control terminal coupled to the odd word line OWL1.

Also, the select unit 120B includes a following gate transistor 122B and a select transistor 124B. The following gate transistor 122B has a first terminal coupled to the second terminal of the anti-fuse transistor 110, a second terminal, and a control terminal coupled to the following gate control line FL. The select transistor 124B has a first terminal coupled to the second terminal of the following gate transistor 122B, a second terminal coupled to the bit line BL2, and a control terminal coupled to the even word line EWL1.

During an program operation of the memory cell 100(1, 1), the select units 120A and 120B can be controlled with the same voltage simultaneously. For example, during the program operation, the odd word line OWL1 and the even word line EWL1 can be at the same high voltage, turning on the select transistors 124A and 124B. Also, the anti-fuse control line AF1 can be at a high program voltage, the following gate control line FL can be at an intermediate voltage that can turn on the following gate transistors 122A and 122B. In this case, the low voltage applied to the bit lines BL1 and BL2 can be passed to the first and second terminals of the anti-fuse transistor 110 through the select units 120A and 120B. Consequently, the high voltage stress applied on the anti-fuse transistor 110 can rupture the anti-fuse transistor 110, and the memory cell 100(1,1) can be programmed.

However, before the memory cell 100(1,1) is programmed, the memory system 10 allows the memory cell 100(1,1) to pre-screen the select units 120A and 120B in advance to see if the memory cell 100(1,1) can function normally. In some embodiments, during the individual pre-screen operation of the memory cell 100(1,1), the odd word line OWL1 and the even word line EWL1 can be at different voltages for testing the select units 120A and 120B in two phases to see whether the select units 120A and 120B can be turned off normally or not.

Figure 2:
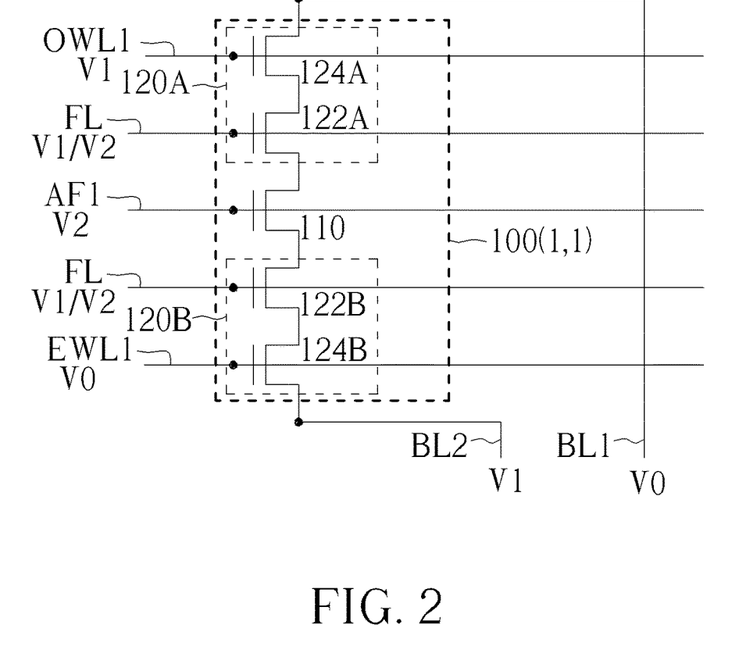
FIG. 2 shows the voltages received by the memory cell in one screen phase during the individual pre-screen operation.

FIG. 2 shows the voltages received by the memory cell 100(1,1) in one screen phase during an individual pre-screen operation of the memory cell 100(1,1). In FIG. 2, the bit line BL1 is at a reference voltage V0, the bit line BL2 is at a first operation voltage V1, the anti-fuse control line AF1 is at a second operation voltage V2, the following gate control line FL is at the first operation voltage V1, the odd word line OWL1 is at the first operation voltage V1, and the even word line EWL1 is at the reference voltage V0.

In some embodiments, the second operation voltage V2 can be greater than or substantially equal to the first operation voltage V1, and the first operation voltage V1 can be greater than the reference voltage V0.

Furthermore, the individual pre-screen operation can be performed with similar voltages used for the read operation to screen the function of the selection units 120A and 120B in a condition similar to the read operation. For example, the second operation voltage V2 can be 2.7V, the first operation voltage V1 can be 1.8V, and the reference voltage V0 can be 0V.

In this case, the following gate transistor 122A and the select transistor 124A in the select unit 120A will be turned on. However, the select transistor 124B should be turned off if the select transistor 124B functions normally. In this case, there should be no current on the bit lines BL1 and BL2.

However, in some cases if the select transistor 124B is defected, the select transistor 124B may not be turned off as expected, thereby causing leakage current from the bit line BL2 to the bit line BL1. Therefore, by sensing the current on the bit lines BL1 and BL2, the defection of the select transistor 124B can be detected. In some embodiments, since the bit line BL1 is at the reference voltage V0, it would be more applicable to couple the bit line BL1 to the current sensing amplifier for sensing the current and screen the select transistor 124B in FIG. 2. However, in some other embodiments, the current sensing amplifier may be coupled to the bit line BL2 for sensing current if the design of the current sensing amplifier permits.

Figure 3:
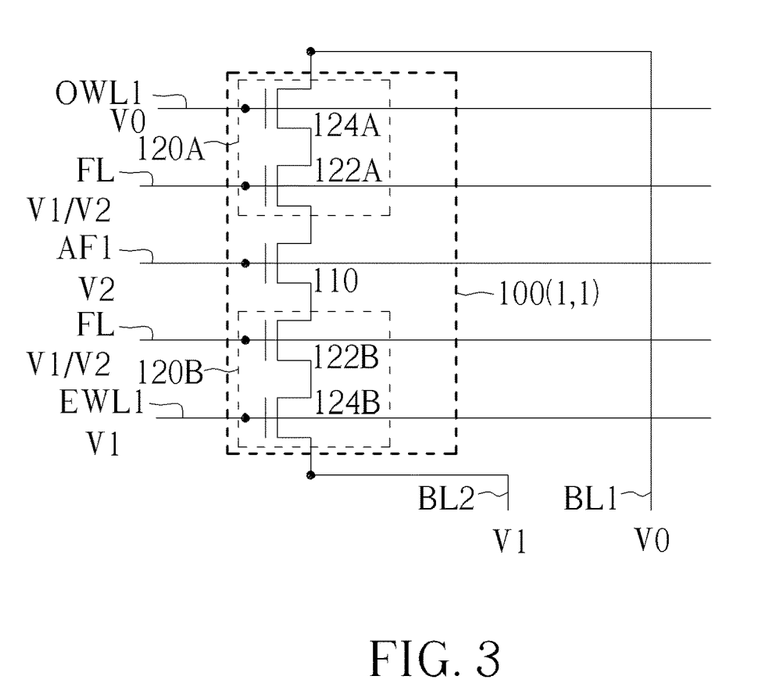
FIG. 3 shows the voltages received by the memory cell in another screen phase during the individual pre-screen operation.

FIG. 3 shows the voltages received by the memory cell 100(1,1) in another screen phase during an individual pre-screen operation of the memory cell 100(1,1). In FIG. 3, the bit line BL1 is at the reference voltage V0, the bit line BL2 is at the first operation voltage V1, the anti-fuse control line AF1 is at the second operation voltage V2, the following gate control line FL is at the first operation voltage V1, the odd word line OWL1 is at the reference voltage V0, and the even word line EWL1 is at the first operation voltage V1.

In this case, the following gate transistor 122B and the select transistor 124B in the select unit 120B will be turned on. However, the select transistor 124A should be turned off if the select transistor 124A functions normally. Therefore, there should be no current on the bit lines BL1 and BL2.

However, in some cases if the select transistor 124A is defected, the select transistor 124A may not be turned off as expected, thereby causing leakage current from the bit line BL2 to the bit line BL1. Therefore, by sensing the current on the bit lines BL1 and BL2, the defection of the select transistor 124A can be detected. In some embodiments, since the bit line BL1 is at the reference voltage V0, the current sensing amplifier can be coupled to the bit line BL1 to sense the current and screen the select transistor 124A in FIG. 3.

That is, the odd word line OWL1 and the even word line EWL1 can be at different voltages during the individual pre-screen operation to turn on the select transistors 124A and 124B indifferent phases so that the select transistor that is meant to be turned off in the present phase can be screened.

In some embodiments, the screen phase shown in FIG. 2 can be performed before the screen phase shown in FIG. 3, and in some other embodiments, the screen phase shown in FIG. 3 can be performed before the screen phase shown in FIG. 2. Furthermore, in some embodiments, the individual pre-screen operation may perform only one of the screen phases shown in FIGS. 2 and 3 according to the system requirement.

In addition, in FIGS. 2 and 3, the bit line BL1 remains at the reference voltage V0, and the bit line BL2 remains at the first operation voltage V1. Therefore, the current sense amplifier can be coupled to the bit line BL1 and sense the current from the bit line BL1 in two different phases since the rather low reference voltage V0 may be more applicable as an input for the current sense amplifier. However, in some other embodiments, the bit line BL1 can be at the first operation voltage V1 and the bit line BL2 can be at the reference voltage V0 during the screen phase for screening the select transistor 124A.

Figure 4:
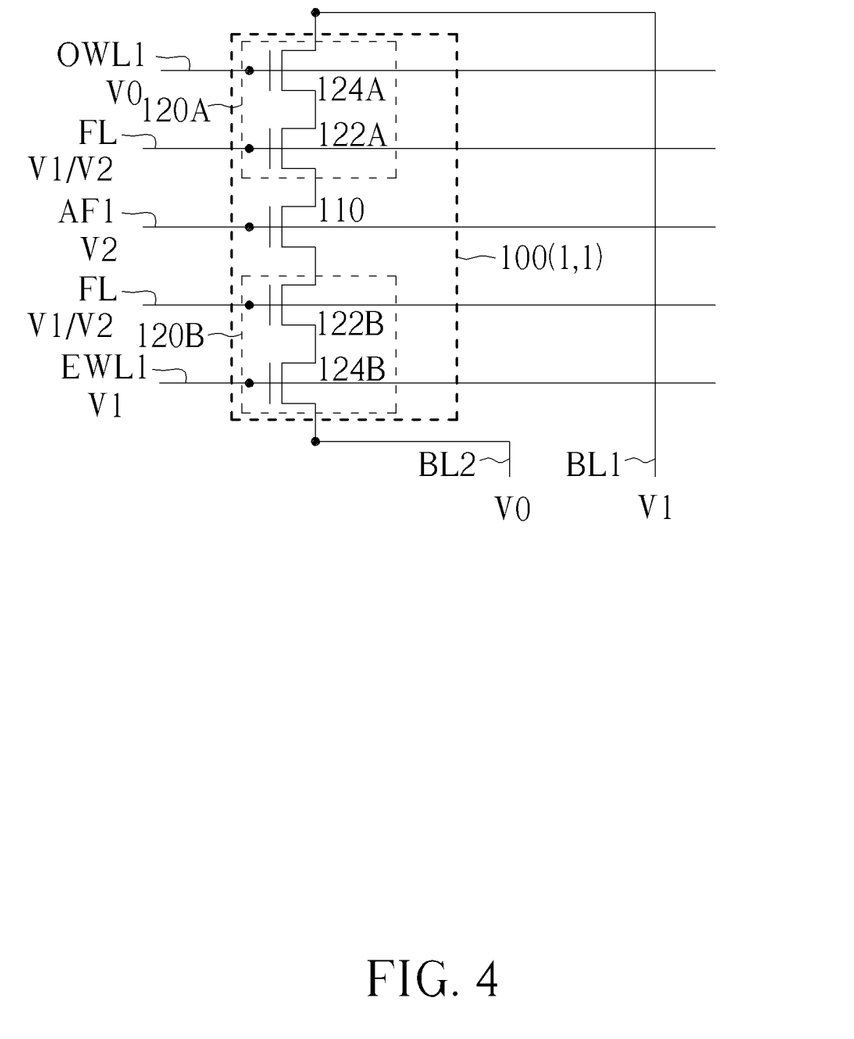
FIG. 4 shows the voltages received by the memory cell in another screen phase during an individual pre-screen operation.

FIG. 4 shows the voltages received by the memory cell 100(1,1) in screen phase for screening the select transistor 124A. In FIG. 4, the bit line BL1 is at the first operation voltage V1, the bit line BL2 is at the reference voltage V0, the anti-fuse control line AF1 is at the second operation voltage V2, the following gate control line FL is at the first operation voltage V1, the odd word line OWL1 is at the reference voltage V0, and the even word line EWL1 is at the first operation voltage V1.

In this case, the select transistor 124B can still be turned on, and the select transistor 124A can be screened by sensing the current from the bit line BL2 with the current sensing amplifier. Furthermore, in FIG. 4, since the bit line BL2 is at the reference voltage V0 while the even word line EWL1 is at the first operation voltage V1, the select transistor 124B can be turned on even more firmly. Also, since the bit line BL1 is at the first operation voltage V1 while the odd word line OWL1 is at the reference voltage V0, the select transistor 124A can be screened even more firmly.

In some embodiments, the individual pre-screen operation can also be performed with similar voltages used for the program operation to test the function of the selection units 120A and 120B in the condition similar to the program operation. For example, the second operation voltage V2 can be 3.5V, the first operation voltage V1 can be 1.8V, and the reference voltage V0 can be 0V. In this case, the following gate control line FL may be at the second operation voltage V2 during the individual pre-screen operation as shown in FIGS. 2 to 4 so that the following gate transistors 122A and 122B can help to buffer the high voltage stress.

That is, according to the system requirement, the individual pre-screen operation can be performed with the program condition and/or the read condition. Furthermore, in some embodiments, if the select transistors of the memory cells are strong enough to endure high voltage stress, the following gate transistors may be omitted.

Figure 5:
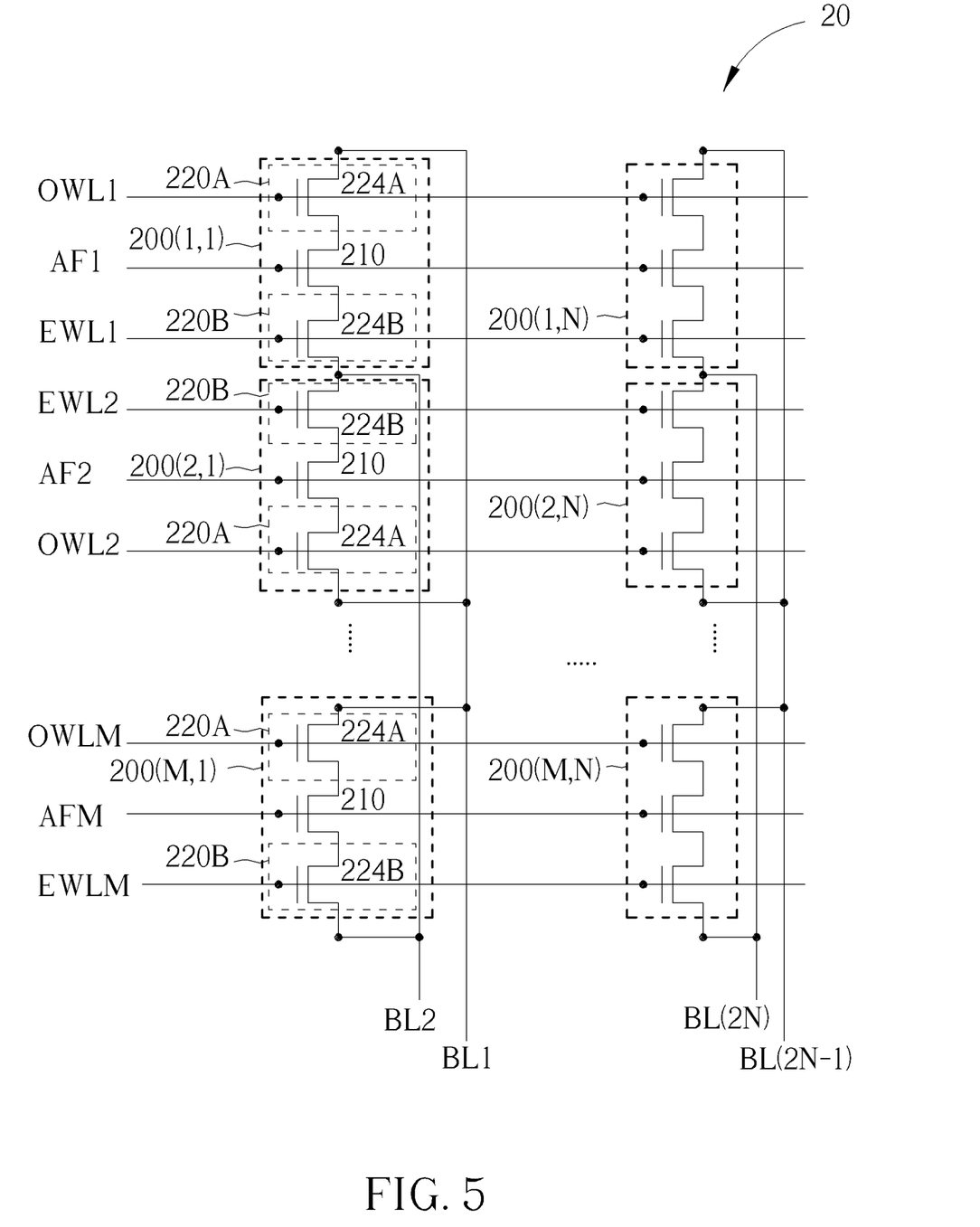
FIG. 5 shows a memory system according to one embodiment of the present invention.

FIG. 5 shows a memory system 20 according to one embodiment of the present invention. The memory system 20 includes a plurality of memory cells 200(1,1) to 200(M,N). The memory systems 10 and 20 have similar structures and can be operated with similar principles. However, the select units 220A and 220B of the memory cells 200(1,1) to 200(M,N) can include the select transistors 224A and 224B.

For example, in FIG. 5, the select unit 220A of the memory cell 200(1,1) can include the select transistor 224A. The select transistor 224A has a first terminal coupled to the first terminal of the anti-fuse transistor 210, a second terminal coupled to the bit line BL1, and a control terminal coupled to the odd word line OWL1. The select unit 220B of the memory cell 200(1,1) can include the select transistor 224B. The select transistor 224B has a first terminal coupled to the second terminal of the anti-fuse transistor 210, a second terminal coupled to the bit line BL2, and a control terminal coupled to the even word line EWL1.

In this case, the voltages applied to the bit lines BL1, BL2, the odd word line OWL1, the even word line EWL1, and the anti-fuse control line AF1 shown in FIGS. 2 to 4 can also be applied to the memory cells 200(1,1) to screen the select transistors 224A and 224B.

Furthermore, in some embodiments, the memory systems 10 and 20 can perform the pre-screen operation to the memory cells 100(1,1) to 100(M,N) and the memory cells 200(1,1) to 200(M,N) individually. However, in some embodiments, to locate the defective select transistors faster, memory cells disposed in the same column can be screened as a group first, and if the screening result shows that there is at least one defective select transistor in these memory cells, then the memory cells disposed in the same column would be screened individually later to locate the defective select transistor. That is, in some embodiments, the group pre-screen operation can be performed first, and the individual pre-screen operation can be performed afterwards to further locate the defect memory cell.

Figure 6:
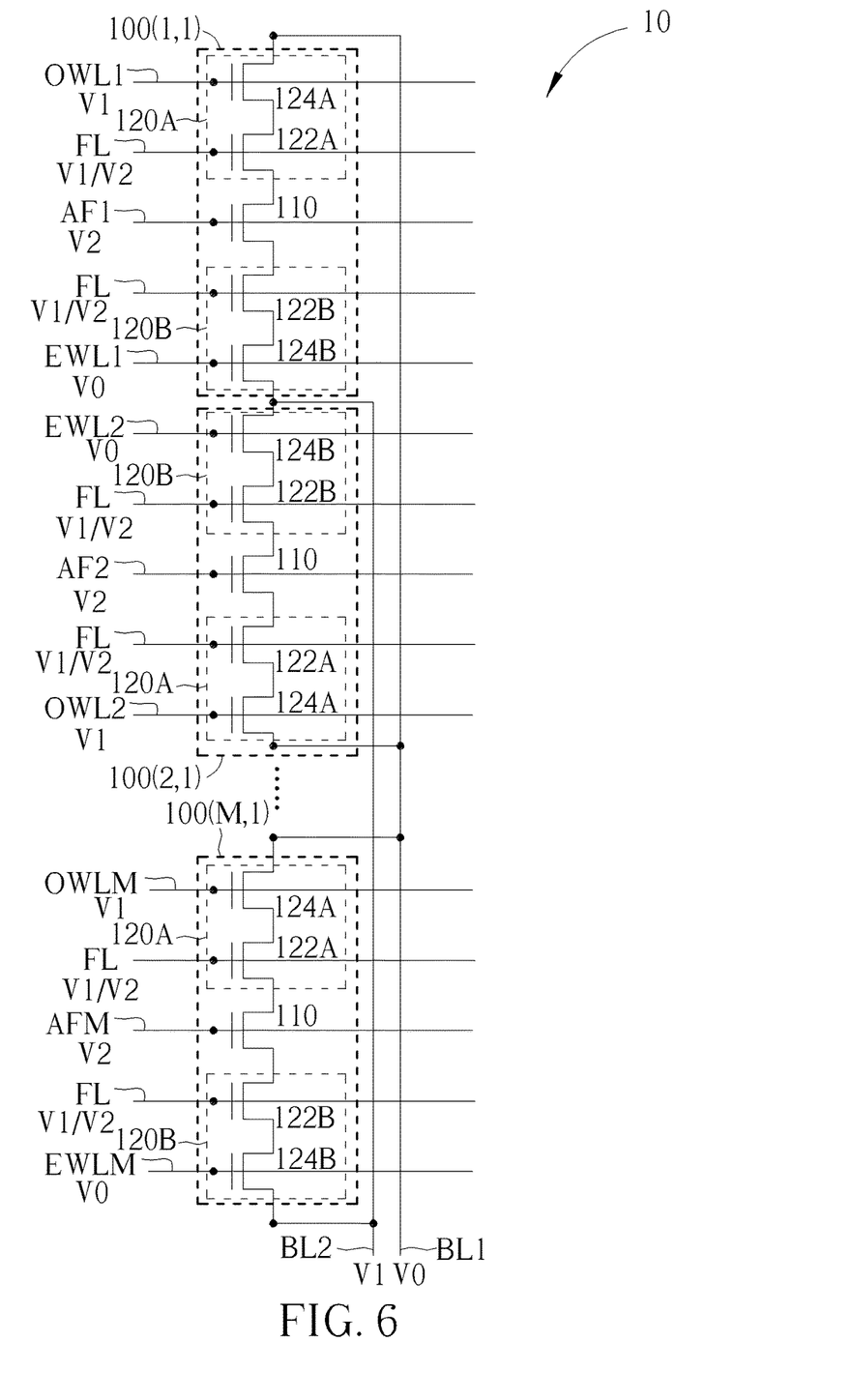
FIG. 6 shows the voltages received by the memory cell in one screen phase during the group pre-screen operation.

FIG. 6 shows the voltages received by the memory cells 100(1,1) to 100(M,1) in a screen phase during a group pre-screen operation of the memory cells 100(1,1) to 100(M,1).

In FIG. 6, the bit line BL1 is at the reference voltage V0, the bit line BL2 is at the first operation voltage V1, the anti-fuse control lines AF1 to AFM are at the second operation voltage V2, the odd word lines OWL1 to OWLM are at the first operation voltage V1, and the even word lines EWL1 to EWLM are at the reference voltage V0.

In this case, the select transistors 124A of the memory cells 100(1,1) to 100(M,1) are turned on while the select transistors 124B of the memory cells 100(1,1) to 100(M,1) should be turned off. However, if any of the select transistors 124B of the memory cells 100(1,1) to 100(M,1) is defected and cannot be turned off normally, then a leakage current will be generated on the bit lines BL1 and BL2. In some embodiments, the current sensing amplifier can be coupled to the bit line BL1 to sense the current for screening the select units 120B of the memory cells 100(1,1) to 100(M,1).

Furthermore, if the leakage current is detected, it may imply at least one of the select transistors 124B of the memory cells 100(1,1) to 100(M,1) is defected. In some embodiments, to further locate the exact select transistor that is defected, the individual pre-screen operation shown in FIG. 2 can be performed to screen the select transistors 124B of memory cells 100(1,1) to 100(M,1) individually.

Figure 7:
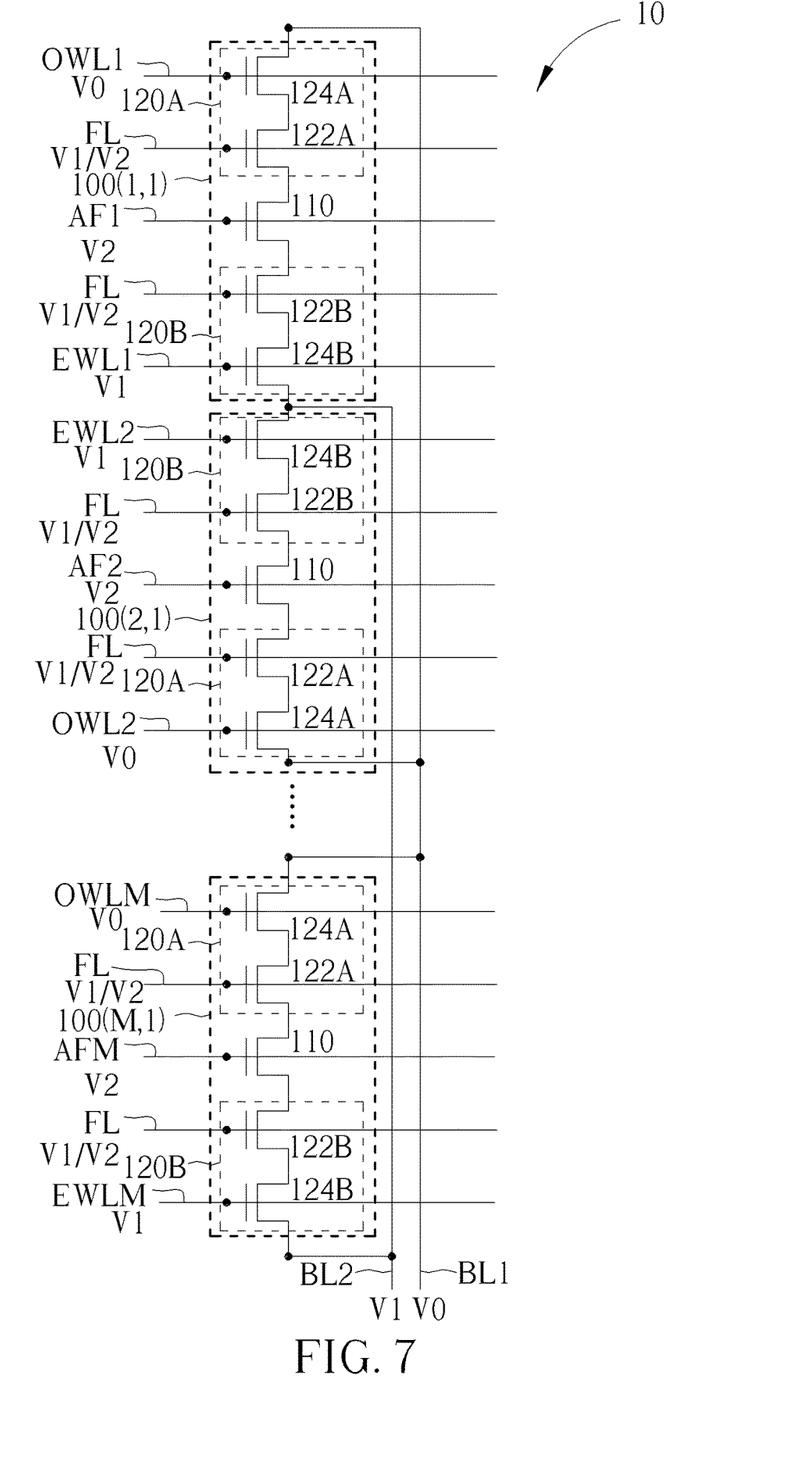
FIG. 7 shows the voltages received by the memory cell in another screen phase during the group pre-screen operation.

FIG. 7 shows the voltages received by the memory cells 100(1,1) to 100(M,1) in another screen phase during a group pre-screen operation of the memory cells 100(1,1) to 100(M,1).

In FIG. 7, the bit line BL1 is at the reference voltage V0, the bit line BL2 is at the first operation voltage V1, the anti-fuse control lines AF1 to AFM are at the second operation voltage V2, the odd word lines OWL1 to OWLM are at the reference voltage V0, and the even word lines EWL1 to EWLM are at the first operation voltage V1.

In this case, the select transistors 124B of the memory cells 100(1,1) to 100(M,1) are turned on while the select transistors 124A of the memory cells 100(1,1) to 100(M,1) should be turned off. However, if any of the select transistor 124A of the memory cells 100(1,1) to 100(M,1) is defected and cannot be turned off normally, then a leakage current will be generated on the bit lines BL1 and BL2. In some embodiments, the current sensing amplifier can be coupled to the bit line BL1 to sense the current for screening the select units 120A of the memory cells 100(1,1) to 100(M,1).

Furthermore, if the leakage current is detected, it may imply at least one of the select transistors 124A of the memory cells 100(1,1) to 100(M,1) is defected. In some embodiments, to further locate the exact select transistor that is defected, the individual pre-screen operation shown in FIG. 3 can be performed to screen the select transistors 124A of memory cells 100(1,1) to 100(M,1) individually.

Figure 8:
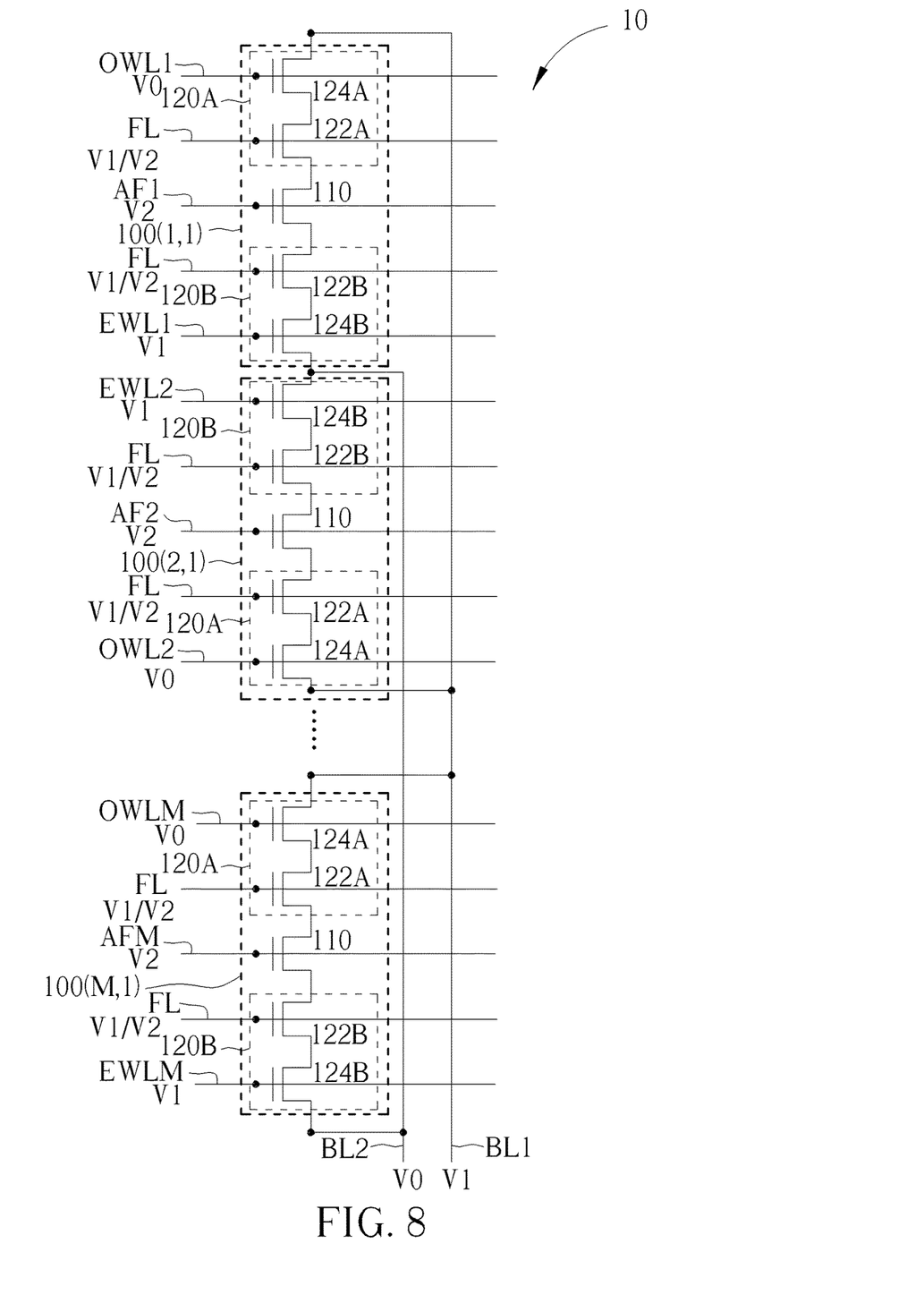
FIG. 8 shows the voltages received by the memory cell in another screen phase during a group pre-screen operation.

FIG. 8 shows the voltages received by the memory cells 100(1,1) to 100(M,1) for screening the select transistors 124A. In FIG. 8, the bit line BL1 is at the first operation voltage V1, the bit line BL2 is at the reference voltage V0, the anti-fuse control lines AF1 to AFM are at the second operation voltage V2, the odd word lines OWL1 to OWLM are at the reference voltage V0, and the even word lines EWL1 to EWLM are at the first operation voltage V1.

In this case, the select transistors 124B of the memory cells 100(1,1) to 100(M,1) are turned on while the select transistors 124A of the memory cells 100(1,1) to 100(M,1) should be turned off. However, if any of the select transistor 124A of the memory cells 100(1,1) to 100(M,1) is defected and cannot be turned off normally, then a leakage current will be generated on the bit lines BL1 and BL2. In some embodiments, the current sensing amplifier can be coupled to the bit line BL2 to sense the current for screening the select units 120A of the memory cells 100(1,1) to 100(M,1).

Furthermore, if the leakage current is detected, it may imply at least one of the select transistors 124A of the memory cells 100(1,1) to 100(M,1) is defected. In some embodiments, to further locate the exact select transistor that is defected, the individual pre-screen operation shown in FIG. 4 can be performed to screen the select transistors 124A of memory cells 100(1,1) to 100(M,1) individually.

Similarly, the voltages applied to the bit lines BL1, BL2, the odd word lines OWL1 to OWLM, the even word lines EWL1 to EWLM, and the anti-fuse control lines AF1 to AFM shown in FIGS. 6 to 8 can also be applied to the memory cells 200(1,1) to 200(M,N) to screen the select transistors 224A and 224B.

Since the memory systems 10 and 20 can perform the group pre-screen operations and the individual pre-screen operations before the memory cells 100(1,1) to 100(M,1) and 200(1,1) to 200(M,N) are programmed, the defected select transistors can be located in an earlier stage, thereby allowing the memory systems 10 and 20 to stop using the defected memory cells and switch to a new set of memory cells. Therefore, the reliability of the memory systems 10 and 20 can be improved.

Figure 9:
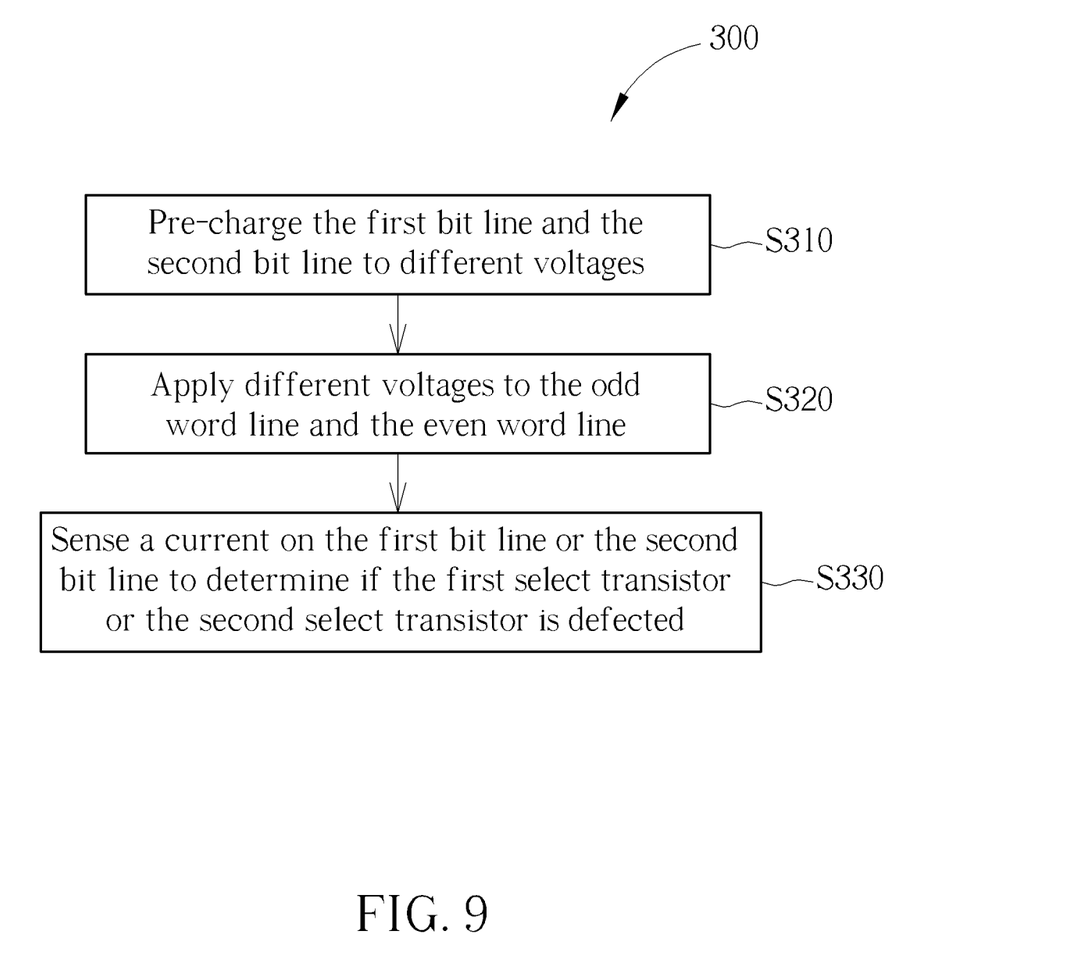
FIG. 9 shows a method for operating the memory systems in FIGS. 1 and 5 according to one embodiment of the present invention.

FIG. 9 shows a method 300 for operating the memory systems 10 and 20 according to one embodiment of the present invention. The method 300 can be used to perform the individual pre-screen operation to screen the select transistors in the memory cells 100(1,1) or 200(1,1).

The method 300 includes steps S310 to S330, but is not limited to the order shown in FIG. 9.

S310: pre-charge the bit lines BL1 and BL2 to different voltages;

S320: apply different voltages to the odd word line OWL1 and the even word line EWL1; and S330: sense a current on the bit line BL1 or BL2 to determine if the select transistor 124A or 124B is defected.

In some embodiments, steps S310 to S330 can be performed to screen one of the select transistor 124A and the select transistor 124B in the memory cell 100(1,1). However, in some other embodiments, the steps S310 to S330 can be performed two times in two phases for screening both the select transistor 124A and the select transistor 124B.

For example, in a first phase of the individual pre-screen operation for screening the select transistor 124A, step S310 can be performed by pre-charging the bit line BL2 to the first operation voltage V1 and pre-charging the bit line BL1 to the reference voltage V0 as shown in FIG. 3. Also, in the first phase, step S320 can be performed by applying the reference voltage V0 to the odd word line OWL1 and applying the operation voltage V1 to the even word line EWL1.

In this case, the current sensing amplifier may be coupled to the bit line BL1 for sensing the current on the bit line BL1 in step S330. If the current is sensed, it may imply that the select transistor 124A cannot be turned off normally and the select transistor 124A will be determined to be defected in step S330.

However, in some other embodiments, the bit line BL1 can be pre-charged to the first operation voltage V1 and the bit line BL2 can be at the reference voltage V0. In this case, the current sensing amplifier may be coupled to the bit line BL2 for sensing the current on the bit line BL2 in step S330.

Also, in a second phase of the individual pre-screen operation for screening the select transistor 124B, step S310 can be performed by pre-charging the bit line BL2 to the first operation voltage V1 and pre-charging the bit line BL1 to reference voltage V0 as shown in FIG. 2. Also, in the second phase, step S320 can be performed by applying the reference voltage V0 to the even word line EWL1 and applying the operation voltage V1 to the odd word line OWL1. In this case, the current sensing amplifier may be coupled to the bit line BL1 for sensing the current on the bit line BL1 in step S330. If the current is sensed, it may imply that the select transistor 124B cannot be turned off normally and the select transistor 124B will be determined to be defected in step S330.

Figure 10:
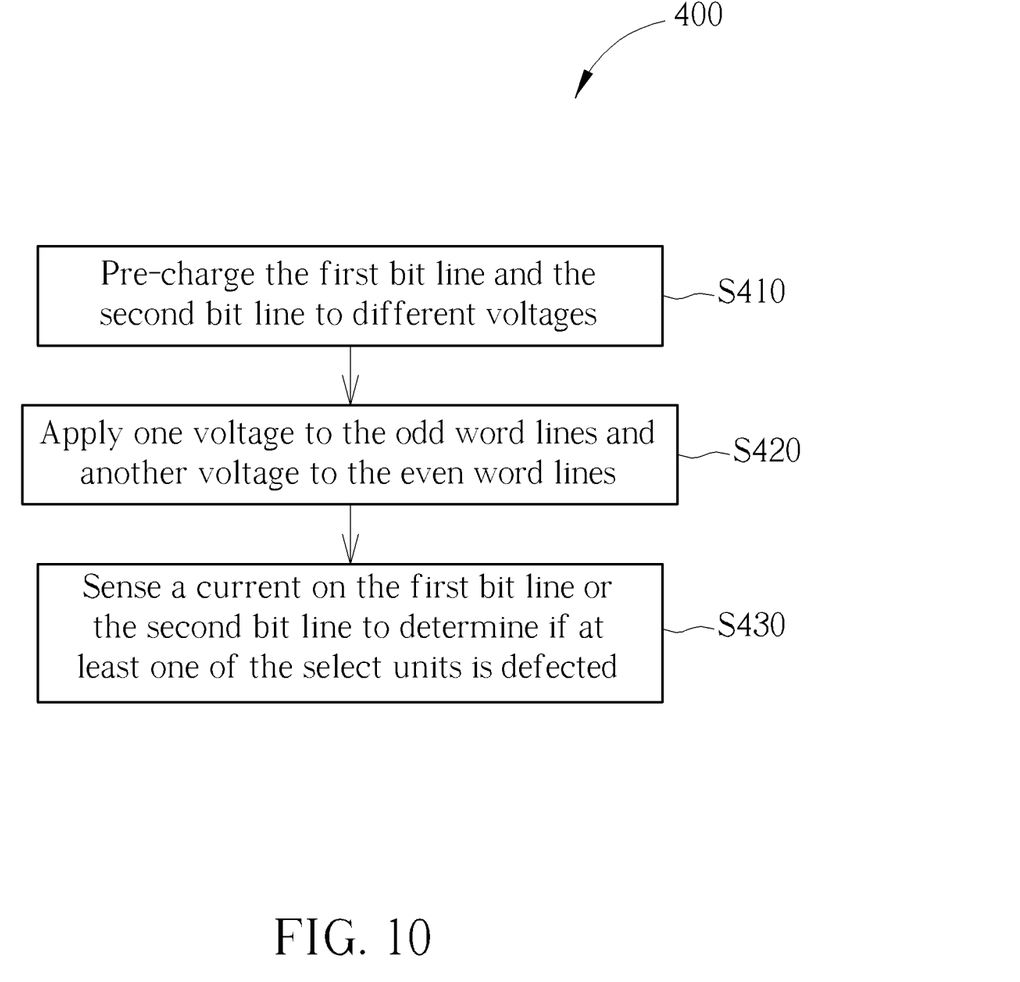
FIG. 10 shows a method for operating the memory systems in FIGS. 1 and 5 according to one embodiment of the present invention.

FIG. 10 shows a method 400 for operating the memory systems 10 and 20 according to one embodiment of the present invention. The method 400 can be used to perform the group pre-screen operation to screen the select transistors in the memory cells 100(1,1) to 100(M,1) and 200(1,1) to 200(M,1).

The method 400 includes steps S410 to S430, but is not limited to the order shown in FIG. 10.

S410: pre-charge the bit lines BL1 and BL2 to different voltages;

S420: apply one voltage to the odd word lines OWL1 to OWLM and another voltage to the even word lines EWL1 to EWLM;

S430: sense a current on the bit line BL1 or BL2 to determine if at least one of the select units is defected.

In some embodiments, steps S410 to S430 can be performed to screen the select units coupled to the odd word lines OWL1 to OWLM or the even word lines EWL1 to EWLM in the memory cells 100(1,1) to 100(M,1). However, in some other embodiments, the steps S410 to S430 can be performed two times in two phases for screening the select transistors coupled to the odd word lines OWL1 to OWLM and the select transistors coupled to the even word lines EWL1 to EWLM.

For example, in a first phase of the group pre-screen operation for screening the select transistors 124A of the memory cells 100(1,1) to 100(M,1), step S410 can be performed by pre-charging the bit line BL2 to the first operation voltage V1 and pre-charging the bit line BL1 to the reference voltage V0 as shown in FIG. 7. Also, step S420 can be performed by applying the first operation voltage V1 to the even word lines EWL1 to EWLM and applying the reference voltage V0 to the odd word lines OWL1 to OWLM.

In this case, the current sensing amplifier may be coupled to the bit line BL1 for sensing the current on the bit line BL1 in step S430. If the current is sensed, it may imply that at least one of the select transistors 124A cannot be turned off normally and it will determine that at least one of the select transistors 124A is defected in step S430. However, in some other embodiments, the bit line BL1 can be pre-charged to the first operation voltage V1 and the bit line BL2 can be at the reference voltage V0. In this case, the current sensing amplifier may be coupled to the bit line BL2 for sensing the current on the bit line BL2 in step S430 in the first phase of the group pre-screen operation.

Also, in a second phase of the group pre-screen operation for screening the select transistors 124B of the memory cells 100(1,1) to 100(M,1), step S410 can be performed by pre-charging the bit line BL2 to the first operation voltage V1 and pre-charging the bit line BL1 to the reference voltage V0 as shown in FIG. 6. Also, step S420 can be performed by applying the first operation voltage V1 to the odd word lines OWL1 to OWLM and applying the reference voltage V0 to the even word lines EWL1 to EWLM. In this case, the current sensing amplifier may be coupled to the bit line BL1 for sensing the current on the bit line BL1 in step S430. If the current is sensed, it may imply that at least one of the select transistors 124B cannot be turned off normally and it will determine that at least one of the select transistors 124B is defected in step S430.

In addition, in some embodiments, if the result of the group pre-screen operation of the method 400 shows that there's at least one defected select transistor in the memory cells 100(1,1) to 100(M,N) or at least one defected select transistor in the memory cells 200 (1,1) to 200 (M,N), then the method 300 can be performed to locate the defected select transistor specifically. In some embodiments, if a memory cell is determined to have a defected transistor, the memory system 100 may stop using the memory cell and rearrange the address map to use other memory cells.

In summary, the memory system and the method for operating the memory system can prescreen the select transistors in the memory cells before the memory cell are programmed, improving the reliability of the memory system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory system comprising:
   a plurality of even word lines;
   a plurality of odd word lines;
   a plurality of anti-fuse control lines;
   a plurality of bit lines; and
   a plurality of memory cells, a first memory cell of the plurality of memory cells comprising:
      a first anti-fuse transistor having a first terminal, a second terminal, and a control terminal coupled to a first anti-fuse control line of the plurality of anti-fuse control lines;
      a first select unit coupled to the first terminal of the first anti-fuse transistor, a first bit line of the plurality of bit lines, and a first odd word line of the plurality of odd word lines, and configured to control an electrical connection between the first terminal of the first anti-fuse transistor and the first bit line according to a voltage of the first odd word line; and
      a second select unit coupled to the second terminal of the first anti-fuse transistor, a second bit line of the plurality of bit lines, and a first even word line of the plurality of even word lines, and configured to control an electrical connection between the second terminal of the first anti-fuse transistor and the second bit line according to a voltage of the first even word line;
   wherein:
   during an individual pre-screen operation of the first memory cell, the first odd word line and the first even word line are at different voltages.

2. The memory system of claim 1, wherein:
   the first select unit comprises:
      a first following gate transistor having a first terminal coupled to the first terminal of the first anti-fuse transistor, a second terminal, and a control terminal coupled to a following gate control line; and
      a first select transistor having a first terminal coupled to the second terminal of the first following gate transistor, a second terminal coupled to the first bit line, and a control terminal coupled to the first odd word line; and
   the second select unit comprises:
      a second following gate transistor having a first terminal coupled to the second terminal of the first anti-fuse transistor, a second terminal, and a control terminal coupled to the following gate control line; and
      a second select transistor having a first terminal coupled to the second terminal of the second following gate transistor, a second terminal coupled to the second bit line, and a control terminal coupled to the first even word line.

3. The memory system of claim 2, wherein during the individual pre-screen operation of the first memory cell, in a first screen phase:
   the first bit line is at a reference voltage;
   the second bit line is at a first operation voltage;
   the first anti-fuse control line is at a second operation voltage;
   the following gate control line is at the first operation voltage or the second operation voltage;
   the first odd word line is at the first operation voltage;
   the first even word line is at the reference voltage; and
   a current on the first bit line is sensed to screen the second select transistor;

wherein the second operation voltage is greater than or substantially equal to the first operation voltage, and the first operation voltage is greater than the reference voltage.

4. The memory system of claim 3, wherein during the individual pre-screen operation of the first memory cell, in a second screen phase:
the first bit line is at the reference voltage;
the second bit line is at the first operation voltage;
the first anti-fuse control line is at the second operation voltage;
the following gate control line is at the first operation voltage or the second operation voltage;
the first odd word line is at the reference voltage;
the first even word line is at the first operation voltage; and
a current on the first bit line is sensed to screen the first select transistor.

5. The memory system of claim 3, wherein during the individual pre-screen operation of the first memory cell, in a second screen phase:
the first bit line is at the first operation voltage;
the second bit line is at the reference voltage;
the first anti-fuse control line is at the second operation voltage;
the following gate control line is at the first operation voltage or the second operation voltage;
the first odd word line is at the reference voltage;
the first even word line is at the first operation voltage; and
a current on the second bit line is sensed to screen the first select transistor.

6. The memory system of claim 2, wherein during the individual pre-screen operation of the first memory cell, in a first screen phase:
the first bit line is at a first operation voltage;
the second bit line is at a reference voltage;
the first anti-fuse control line is at a second operation voltage;
the following gate control line is at the first operation voltage or the second operation voltage;
the first odd word line is at the first operation voltage;
the first even word line is at the reference voltage; and
a current on the second bit line is sensed to screen the second select transistor;
wherein the second operation voltage is greater than or substantially equal to the first operation voltage, and the first operation voltage is greater than the reference voltage.

7. The memory system of claim 1, wherein:
the first select unit comprises:
a first select transistor having a first terminal coupled to the first terminal of the first anti-fuse transistor, a second terminal coupled to the first bit line, and a control terminal coupled to the first odd word line; and
the second select unit comprises:
a second select transistor having a first terminal coupled to the second terminal of the first anti-fuse transistor, a second terminal coupled to the second bit line, and a control terminal coupled to the first even word line.

8. The memory system of claim 7, wherein during the individual pre-screen operation of the first memory cell, in a first screen phase:
the first bit line is at a reference voltage;
the second bit line is at a first operation voltage;
the first anti-fuse control line is at a second operation voltage;
the first odd word line is at the first operation voltage;
the first even word line is at the reference voltage; and
a current on the first bit line is sensed to screen the second select transistor;
wherein the second operation voltage is greater than or substantially equal to the first operation voltage, and the first operation voltage is greater than the reference voltage.

9. The memory system of claim 8, wherein during the individual pre-screen operation of the first memory cell, in a second screen phase:
the first bit line is at the reference voltage;
the second bit line is at the first operation voltage;
the first anti-fuse control line is at the second operation voltage;
the first odd word line is at the reference voltage;
the first even word line is at the first operation voltage; and
a current on the first bit line is sensed to screen the first select transistor.

10. The memory system of claim 8, wherein during the individual pre-screen operation of the first memory cell, in a second screen phase:
the first bit line is at the first operation voltage;
the second bit line is at the reference voltage;
the first anti-fuse control line is at the second operation voltage;
the first odd word line is at the reference voltage;
the first even word line is at the first operation voltage; and
a current on the second bit line is sensed to screen the first select transistor.

11. The memory system of claim 7, wherein during the individual pre-screen operation of the first memory cell, in a first screen phase:
the first bit line is at a first operation voltage;
the second bit line is at a reference voltage;
the first anti-fuse control line is at a second operation voltage;
the first odd word line is at the first operation voltage;
the first even word line is at the reference voltage; and
a current on the second bit line is sensed to screen the second select transistor;
wherein the second operation voltage is greater than or substantially equal to the first operation voltage, and the first operation voltage is greater than the reference voltage.

12. The memory system of claim 1, wherein a second memory cell of the plurality of memory cells comprises:
a second anti-fuse transistor having a first terminal, a second terminal, and a control terminal coupled to a second anti-fuse control line of the plurality of anti-fuse control lines;
a third select unit coupled to the first terminal of the second anti-fuse transistor, the first bit line, and a second odd word line of the plurality of odd word lines, and configured to control an electrical connection between the first terminal of the second anti-fuse transistor and the first bit line according to a voltage of the second odd word line; and
a fourth select unit coupled to the second terminal of the second anti-fuse transistor, the second bit line, and a second even word line of the plurality of even word lines, and configured to control an electrical connection between the second terminal of the second anti-fuse transistor and the second bit line according to a voltage of the second even word line.

13. The memory system of claim 12, wherein during a group pre-screen operation of the first memory cell and the second memory cell, in a first screen phase:
the first bit line is at a reference voltage;
the second bit line is at a first operation voltage;
the first anti-fuse control line and the second anti-fuse control line are at a second operation voltage;
the first odd word line and the second odd word line are at the first operation voltage;
the first even word line and the second even word line are at the reference voltage; and
a current on the first bit line is sensed to screen the second select unit and the fourth select unit;
wherein the second operation voltage is greater than or substantially equal to the first operation voltage, and the first operation voltage is greater than the reference voltage.

14. The memory system of claim 13, wherein during the group pre-screen operation of the first memory cell and the second memory cell, in a second screen phase:
the first bit line is at the reference voltage;
the second bit line is at the first operation voltage;
the first anti-fuse control line and the second anti-fuse control line are at the second operation voltage;
the first odd word line and the second odd word line are at the reference voltage;
the first even word line and the second even word line are at the first operation voltage; and
a current on the first bit line is sensed to screen the first select unit and the third select unit.

15. The memory system of claim 13, wherein during the group pre-screen operation of the first memory cell and the second memory cell, in a second screen phase:
the first bit line is at the first operation voltage;
the second bit line is at the reference voltage;
the first anti-fuse control line and the second anti-fuse control line are at the second operation voltage;
the first odd word line and the second odd word line are at the reference voltage;
the first even word line and the second even word line are at the first operation voltage; and
a current on the second bit line is sensed to screen the first select unit and the third select unit.

16. The memory system of claim 12, wherein during a group pre-screen operation of the first memory cell and the second memory cell, in a first screen phase:
the first bit line is at a first operation voltage;
the second bit line is at a reference voltage;
the first anti-fuse control line and the second anti-fuse control line are at a second operation voltage;
the first odd word line and the second odd word line are at the first operation voltage;
the first even word line and the second even word line are at the reference voltage; and
a current on the second bit line is sensed to screen the second select unit and the fourth select unit;
wherein the second operation voltage is greater than or substantially equal to the first operation voltage, and the first operation voltage is greater than the reference voltage.

17. The memory system of claim 12, wherein the individual pre-screen operation is performed after the group pre-screen operation.

18. A method for operating a memory system, the memory system comprising a plurality of memory cells, a first memory cell of the plurality of memory cells comprising a first anti-fuse transistor, a first select unit and a second select unit, the first anti-fuse transistor having a first terminal, a second terminal, and a control terminal coupled to a first anti-fuse control line, the first select unit being coupled to the first terminal of the first anti-fuse transistor, a first bit line, and a first odd word line, the second select unit being coupled to the second terminal of the first anti-fuse transistor, a second bit line, and a first even word line, the method comprising:
during a first screen phase of an individual pre-screen operation of the first memory cell:
pre-charging the first bit line and the second bit line to different voltages;
applying different voltages to the first odd word line and the first even word line; and
sensing a current on the first bit line or the second bit line to determine if the first select unit or the second select unit is defected.

19. The method of claim 18, wherein during the first screen phase of the individual pre-screen operation, applying the different voltages to the first odd word line and the first even word line comprises:
applying a reference voltage to the first odd word line; and
applying a first operation voltage greater than the reference voltage to the first even word line;
wherein sensing the current on the first bit line or the second bit line to determine if the first select unit or the second select unit is defected comprises determining the first select unit is defected when the current is sensed.

20. The method of claim 19 further comprising:
during a second screen phase of the individual pre-screen operation:
pre-charging the first bit line and the second bit line to different voltages;
applying the first operation voltage to the first odd word line;
applying the reference voltage to the first even word line; and
sensing a current on the first bit line or the second bit line to determine if the second select unit is defected or not.

21. The method of claim 18, wherein a second memory cell of the plurality of memory cells comprises a second anti-fuse transistor, a third select unit and a fourth select unit, the second anti-fuse transistor having a first terminal, a second terminal, and a control terminal coupled to a second anti-fuse control line, the third select unit being coupled to the first terminal of the second anti-fuse transistor, the first bit line, and a second odd word line, the fourth select unit being coupled to the second terminal of the second anti-fuse transistor, the second bit line, and a second even word line, and the method further comprises during a first screen phase of a group pre-screen operation of the first memory cell and the second memory cell:
pre-charging the first bit line and the second bit line to different voltages;
applying one voltage to the first odd word line and the second odd word line, and another voltage to the first even word line and the second even word line; and
sensing a current on the first bit line or the second bit line to determine if at least one of the first select unit and the third select unit is defected or at least one of the second select unit and the fourth select unit is defected.

22. The method of claim 21, wherein during the first screen phase of the group pre-screen operation, applying one voltage to the first odd word line and the second odd word line, and another voltage to the first even word line and the second even word line comprises:
- applying a reference voltage to the first odd word line and the second odd word line; and
- applying a first operation voltage greater than the reference voltage to the first even word line and the second even word line;
- wherein sensing the current on the first bit line or the second bit line to determine if at least one of the first select unit and the second select unit is defected or at least one of the third select unit and the fourth select unit is defected comprises determining at least one of the first select unit and the second select unit is defected when the current is sensed.

23. The method of claim 22 further comprising:
during a second screen phase of the group pre-screen operation:
pre-charging the first bit line and the second bit line to different voltages;
applying the first operation voltage to the first odd word line and the second odd word line;
applying the reference voltage to the first even word line and the second even word line; and
sensing a current on the first bit line or the second bit line to determine if at least one of the second select unit and the fourth select unit is defected or not.

24. The method of claim 22, wherein the individual pre-screen operation is performed after the group pre-screen operation.

* * * * *